United States Patent [19]

Kuriyama et al.

[11] Patent Number: 4,851,481

[45] Date of Patent: Jul. 25, 1989

[54] EPOXY RESIN COMPOSITION

[75] Inventors: Akira Kuriyama, Higashi-osaka; Tatsuya Okuno, Otsu, both of Japan

[73] Assignee: Sunstar Giken Kabushiki Kaisha, Japan

[21] Appl. No.: 281,935

[22] Filed: Dec. 6, 1988

Related U.S. Application Data

[63] Continuation of Ser. No. 120,039, Nov. 13, 1987, abandoned.

[30] Foreign Application Priority Data

Nov. 13, 1986 [JP] Japan ............................. 61-270682
Jul. 17, 1987 [JP] Japan ............................. 62-179653

[51] Int. Cl.$^4$ ............................................. C08F 283/04
[52] U.S. Cl. ...................................... 525/454; 525/476
[58] Field of Search ............................. 525/476, 454

[56] References Cited

U.S. PATENT DOCUMENTS 3,755,223  8/1973  Engel ................................. 525/476
4,385,158  5/1983  Mikami et al. ..................... 525/476

*Primary Examiner*—Melvyn I. Marquis
*Attorney, Agent, or Firm*—Wegner & Bretschneider

[57] ABSTRACT

An improved epoxy resin composition having improved crack resistance and toughness with maintaining the excellent mechanical and electrical properties, which comprises an epoxy resin dispersed with silicone resin particles which are a crosslinking reaction product of one or more organopolysiloxanes having silanol groups at both ends and one or more organosilane compounds having at least two alkoxysilyl groups within one molecule thereof. The epoxy resin compositions of this invention are useful as sealing materials for IC, and also as coating materials, paints, adhesives, and prepregs.

5 Claims, No Drawings

EPOXY RESIN COMPOSITION

This application is a continuation of United States application Ser. No. 120,039, filed Nov. 13, 1987, now abandoned.

This invention relates to an epoxy resin composition. More particularly, this invention relates to an improved epoxy resin composition comprising specific silicone resin particles stably dispersed in an epoxy resin matrix, where the epoxy resin shows improved crack resistance and toughness.

TECHNICAL BACKGROUND AND PRIOR ART

As is well known, epoxy resin compositions have exellent mechanical properties such as excellent tensile strength and flexural strength and also excellent electrical properties such as excellent dielectric properties and volume resistivity, and hence, the compositions have widely been used in various utilities, such as adhesive materials, coating materials, insulating materials for various electric and electronic devices.

However, the epoxy resin of the main component in these compositions has usually inferior in crack resistance and toughness and further it is difficult to relax the stress due to shrinkage when cured. In order to improve these drawbacks, there have been proposed various modifications of the composition. For example, (1) it is incorporated with specific epoxy resins, such as polyethylene glycol diglycidyl ether, hexanediol diglycidyl ether, urethane-modified epoxy resin, thiocolmodified epoxy resin, dodecenylsuccinic anhydride, polyazelaic polyhydride, and the like, in order to give flexibility to the composition, or (2) particles of rubber having low glass transition temperature (Tg) such as modified acrylonitrile-butadiene rubber or acrylic rubber are dispersed therein.

According to the method of the above (1), however, the resulting composition has slower curing speed, lower heat resistance and further the cured product thereof loses its flexibility with lapse of time. Besides, according to the method of the above (2), the resin has undesirable increased water absorption.

OBJECT OF THE INVENTION

The present inventors have intensively studied to improve the properties of the epoxy resin and have found that improved properties of the epoxy resin can be improved by adding a specific organopolysiloxane having silanol groups at both ends and a specific organosilane compound having at least two alkoxysilyl groups within one molecule to the epoxy resin, mixing them with stirring optionally with heating, by which particles of silicone resin (the resulting crosslinking reaction product of the organopolysiloxane and the organosilane compound) are uniformly and stably dispersed within the epoxy resin matrix.

An object of the invention is to provide an improved epoxy resin composition having improved crack resistance and toughness while maintaining the excellent mechanical and electrical properties. Another object of the invention is to provide an epoxy resin composition which comprises a stable dispersion of specific silicone resin particles in an epoxy resin matrix. These and other objects and advantages of the invention will be apparent from the following description.

DETAILED DESCRIPTION OF THE INVENTION

The resin composition of the invention is prepared by dispersing in 100 parts by weight of an epoxy resin silicone resin particles comprising a reaction mixture of (a) 5 to 200 parts by weight of an organopolysiloxane having silanol groups at both ends of the following formula:

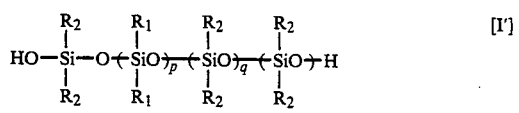

or

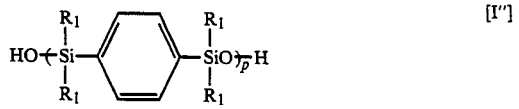

wherein $R_1$ is methyl or phenyl, $R_2$ is phenyl, p is an integer of 9 to 500, and q is 0 or less than 6% of p, which is used alone or in combination of two or more thereof, with one or more organosilane compounds having at least two alkoxysilyl groups in one molecule which are selected from the group consisting of (b) an aminosilane compound of the formula:

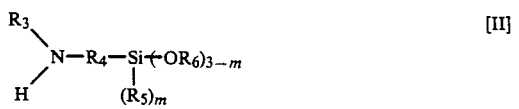

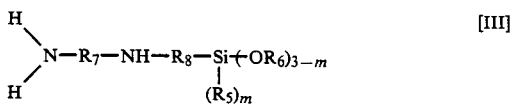

wherein $R_3$ is hydrogen, phenyl, benzyl, cyclohexyl, vinylbenzyl, or allyl, $R_4$ is —$C_2H_4$—, —$C_3H_6$— or —$C_2H_4SC_2H_4$—, $R_5$ and $R_6$ are the same or different and are each methyl or ethyl, $R_7$ is —$C_2H_4$—, —$C_2H_4SC_2H_4$—, —$C_2H_4NHC_2H_4$—, or —CO—, $R_8$ is —$C_2H_4$— or —$C_3H_6$—, and m is 0 or 1, which may be used alone or in combination of two or more thereof, (c) a mercapto compound of the formula:

wherein $R_5$, $R_6$ and m are as defined above, and $R_9$ is —$C_3H_6$— or —$CH_2$—, (d) an epoxy silane compound of the formula:

or

-continued

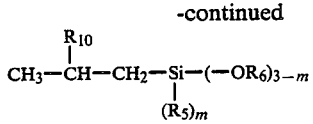   [V']

wherein $R_5$, $R_6$ and m are as defined above, and $R_{10}$ is

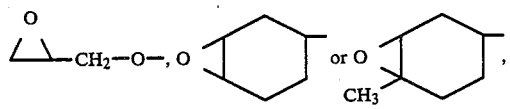

which may be used alone or in combination of two or more thereof, and (e) an isocyanatosilane compound of the formula:

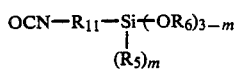   [VI]

wherein $R_5$, $R_6$ and m are as defined above, and $R_{11}$ is —A— or —Q—NHCOX—A— (wherein A is an alkylene having one to 3 carbon atoms, preferably two or more carbon atoms, more preferably three or more carbon atoms, such as —(CH$_2$)$_2$— or —(CH$_2$)$_3$—, Q is a diisocyanate residue, such as a residue of aromatic diisocyanates (e.g. 2,4- or 2,6-tolylene diisocyanate, 4,4'-diphenylmethane diisocyanate, etc.), a residue of aliphatic diisocyanates (e.g. hexamethylene diisocyanate, lysine diisocyanate, isophorone diisocyanate, hydrogenated MDI (MDI=diphenylmethane-4,4'-diisocyanate), hydrogenated TDI (TDI=tolylene diisocyanate), etc.), and X is —NH—, —O— or —S—, said organopolysiloxane having silanol groups at both ends and said organosilane compound having at least two alkoxysilyl groups in one molecule being used in a molar ratio of the alkoxy groups in the organosilane compound and the hydroxy groups in the organopolysiloxane ([OR$_6$]/[OH]) of 0.1 to 15.

In one preferred feature of this invention, the epoxy resin composition comprises a dispersion of 100 parts by weight of the epoxy resin of the formula [I] with the silicone resin particles which are a crosslinking reaction product of 5 to 200 parts by weight the organopolysiloxane having silanol groups at both end (a) and 0.5 to 10 parts by weight of the organosilane compound (b) selected from the compounds of the formulae [II] and [III].

In another feature of the invention, the organosilane compounds (b) of the formulae [II] and [III] (wherein m is 1) are used and the organosilane compound (f) of the formula [VII] (wherein m is 0) is used in an amount of 0.5 to 10 parts by weight. In a further feature of the invention, the organosilane compound (b) of the formula [II] or [III] (wherein m is 1) is used together the organosilane compound (b) of the formula [II] or [III] (wherein m is 0) in the ratio of the compound (m=0) to the compound (m=1) being in the range of 1 : 4 or more by weight, and the organosilane compound (f) of the formula [VII] is used in an amount of 0.5 to 5 parts by weight.

The epoxy resin used in the present invention includes any conventional epoxy resin. Suitable examples are as follows which may be used alone or in combination of two or more thereof:

(1) Glycidylamine type epoxy resins:

Epoxy resins having at least one N,N-diglycidylamino group, such as N,N,N',N'-tetraglycidylaminediphenyl-methane, N,N-diglycidylmeta-(or para-)aminophenol glycidyl ether, and their condensation products. Some of them are commercially available in the name of Araldite MY 720 (manufactured by Ciba-Geigy), and Epotohto YH 434, YH 120 (manufactured by Toto Kasei K.K.).

(2) Novolak type epoxy resins:

Phenol novolak type epoxy resins, some of which are commercially available in the name of Epikote 152 and 154 (manufactured by Shell Chemical), Dow Epoxy Resin DEN 431, 438, 439 and 485 (manufactured by Dow Chemical), Ciba-Geigy EPN 1138 and 1139 (manufactured by Ciba-Geigy), and the like.

Cresol novolak type epoxy resins, some of which are commercially available in the name of Ciba-Geigy ECN 1235, 1273, 1280, and 1299 (manufactured by Ciba-Geigy), EOCN 102, 103 and 104 (manufactured by Nippon Kagyosha K.K.), and the like.

(3) Bisphenol A type epoxy resins:

Commercially available bisphenol A type epoxy resins are Epikote 828, 834, 827, 1001, 1002, 1004, 1007, and 1009 (manufactured by Yuka Shell K.K.), Dow Epoxy DER 331, 332, 662, 663U, and 662U (manufactured by Dow Chemical), Araldite 6071, 7071 and 7072 (manufactured by Ciba-Geigy), Epiclon 840, 850, 855, 860, 1050, 3050, 4050, and 7050 (manufactured by Dainippon Ink & Chemicals, Inc.), and the like.

Urethane-modified bisphenol A type epoxy resins, some of which are commercially available in the name of Adeka Resin EPV-6, EPV-9, and EPV-15 (manufactured by Asahi Denka Kogyo K.K.), and the like.

Brominated bisphenol A type epoxy resins, some of which are commecially available in the name of Araldite 8011 (manufactured by Ciba-Geigy), Dow Epoxy Resin DER 511 (manufactured by Dow Chemical), and the like.

(4) Alicyclic epoxy resins, some of which are commercially available in the name of Araldite CY-179, CY-178, CY-182, and CY-183 (manufactured by Ciba-Geigy), and the like.

(5) Others: bisphenol F type, resorcinol type, tetrahydroxyphenylethane type, polyalcohol type, polyglycol type, glycerin triether type, polyolefin type, epoxylated soybean oil type, and ester type epoxy resins are also included.

Among these epoxy resins, the resins being usually liquid at room temperature can be used as they stand, and the resins being solid at room temperature can also be used by heating at a temperature of its melting point or higher, or alternatively by liquefying it by mixing with a liquid epoxy resin.

The organopolysiloxane having silanol groups at both ends (a) of the formulae [I], [I'] and/or [I''] includes commercially available products such as silanol-terminated polydimethylsiloxane, silanol-terminated diphenylsiloxane, silanol-terminated polydimethyldiphenylsiloxane, polytetramethyl-p-silylphenylenesiloxane (which are manufactured by Chisso K.K.). The organopolysiloxanes are incorporated in an amount of 5 to 200 parts by weight, preferably 5 to 50 parts by weight, to 100 parts by weight of the epoxy resin. When the amount is less than 5 parts by weight, the desired improvement of the properties of the epoxy resin can not be achieved, and on the other hand, when the amount is over 200 parts by weight, the resin composition becomes disadvantageously gel-like material.

The aminosilane compound (b) of the formulae [II] and/or [III] used in this invention includes the following specific compounds (chemical formula and chemical name):

The epoxysilane compounds of the formulae [V] and/or [V'] include the following specific compounds (the chemical structure and chemical name):

Aminosilane compounds of the formula [II]:

| Formula | Name |
|---|---|
| $H_2NC_3H_6Si(OC_2H_5)_3$ | γ-Aminopropyltriethoxysilane |
| $H_2NC_2H_4Si(OCH_3)_3$ | β-Aminoethyltrimethoxysilane |
| $H_2NC_3H_6Si(OC_2H_5)_2$<br>  \|<br>  $CH_3$ | γ-Aminopropyldiethoxymethylsilane |
| $CH_2=CHCH_2NHC_3H_6Si(OCH_3)_3$ | γ-Allylaminopropyltrimethoxysilane |
| $H_2NC_2H_4SC_2H_4Si(OC_2H_5)_2$<br>  \|<br>  $CH_3$ | β-(β-Aminoethylthioethyl)-diethoxymethylsilane |
| $H_2NC_2H_4SC_2H_4Si(OC_2H_5)_3$ | β-(β-Aminoethylthioethyl)-triethoxysilane |
| C₆H₅—HNC₃H₆Si(OCH₃)₃ | β-Phenylaminopropyltrimethoxysilane |
| C₆H₁₁—HNC₃H₆Si(OCH₃)₃ | γ-Cyclohexylaminopropyltrimethoxysilane |
| C₆H₅—CH₂NHC₃H₆Si(OCH₃)₃ | γ-Benzylaminopropyltrimethoxysilane |
| CH₂=CH—C₆H₄—CH₂NHC₃H₆Si(OC₂H₅)₃ | γ-(Vinylbenzylaminopropyl)triethoxysilane |

Aminosilane compounds of the formula [III]:

| Formula | Name |
|---|---|
| $H_2NC_2H_4NHC_3H_6Si(OCH_3)_3$ | N—β-(Aminoethyl)-γ-aminopropyltrimethoxysilane |
| $H_2NC_2H_4NHC_3H_6Si(OCH_3)_2$<br>  \|<br>  $CH_3$ | N—β-(Aminoethyl)-γ-aminopropylmethyldimethoxysilane |
| $H_2NC_2H_4NHCH_2Si(OCH_3)_3$ | β-Aminoethylaminomethyl-trimethoxysilane |
| $H_2NC_2H_4NHC_2H_4NHC_3H_6Si(OCH_3)_3$ | γ-[β-(β-Aminoethylamino)-ethylamino]propyl—trimethoxysilane |
| $H_2NCNH(CH_2)_3Si(OC_2H_5)_3$<br>  $\parallel$<br>  $O$ | N—(3-Triethoxysilylpropyl)urea |

The mercaptosilane compound of the formula [IV] includes the following specific compounds (the chemical formula and chemical name):

| Formula | Name |
|---|---|
| $HS-CH_2CH_2CH_2-Si(OCH_3)_2$<br>  \|<br>  $CH_3$ | 3-Mercaptopropylmethyldimethoxysilane |
| $HS-CH_2CH_2CH_2-Si(OC_2H_5)_3$ | 3-Mercaptopropyltriethoxysilane |
| $HS-CH_2-Si(OCH_3)_3$ | Mercaptomethyltrimethoxysilane |
| $HS-CH_2CH_2CH_2-Si(OCH_3)_3$ | 3-Mercaptopropyltrimethoxysilane |

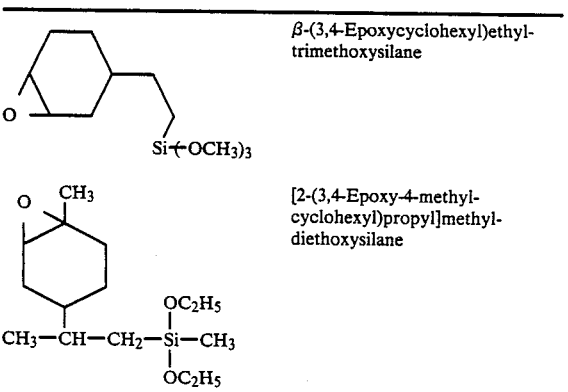

β-(3,4-Epoxycyclohexyl)ethyltrimethoxysilane

[2-(3,4-Epoxy-4-methylcyclohexyl)propyl]methyldiethoxysilane

-continued

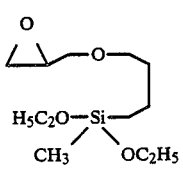  3-(Glycidoxypropyl)methyl-diethoxysilane

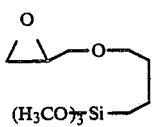  3-Glycidoxypropyltrimethoxysilane

The isocyanatosilane compound of the formula [VI] (e) used in the invention includes the following specific compounds (the chemical formula and chemical name):

| | |
|---|---|
| OCN—CH$_2$CH$_2$CH$_2$—Si(—OC$_2$H$_5$)$_3$ | γ-Isocyanatopropyltriethoxysilane |
| OCN—CH$_2$CH$_2$CH$_2$—Si(—OCH$_3$)$_3$ | γ-isocyanatopropyltrimethoxysilane |

These organosilane compounds (b) to (e) function as a dispersion stabilizer and curing agent. One or more compounds selected from these groups of compounds are used. They are used in an amount (in case of mixture of two or more thereof, total amount) of a molar ratio of the alkoxy groups to the hydroxy groups in the organopolysiloxane (a): [OR$_6$]/[OH] of 0.1 to 15. When the molar ratio is less than 0.1, the desired dispersion stability can not be achieved, and on the other hand, when the molar ratio is over 15, the epoxy resin composition dispersed with the silicone resin particles shows inferior viscosity stability. In the epoxy resin composition of this invention, in view of the adhesion at the interface between the epoxy resin and the silicone resin particles, they may occasionally be used in a fairly large molar ratio of the alkoxy groups to the hydroxy groups (silanol groups).

In addition to the above organosilane compounds (b) to (e), the following organosilane compounds (f) and (g) may optionally be incorporated.

(f) Organosilane compounds of the formula:

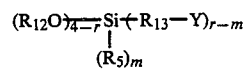  [VII]

wherein R$_5$ is as defined above, R$_{12}$ is methyl or ethyl, R$_{13}$ is —CH$_2$—, —C$_2$H$_4$— or —C$_3$H$_6$—, Y is CH$_2$=Ch—, C$_6$H$_5$—, C$_n$F$_{2n+1}$ (n=1–10), CF$_3$COO—, NC—, or NC(CH$_2$)$_3$S—, and r is 0, 1 or 2, m is 0 or 1 when r is 2.

(g) Organosilane compounds of the formula:

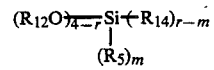  [VIII]

wherein R$_5$ and R$_{12}$ are as defined above, R$_{14}$ is C$_{n'}$H$_{2n'+1}$ (n'=1–20), CH$_2$=CH—, or C$_6$H$_5$—, and r is 0, 1 or 2, and m is 0 or 1 when r is 2.

By these organosilane compounds (f) and (g), only the silicone resins are crosslinked to form particles without crosslinking the epoxy resin.

The specific examples (the chemical structure and chemical name) of the organosilane compounds (f) and (g) are as follows:

| | |
|---|---|
| (C$_2$H$_5$O)$_4$Si | Tetraethoxysilane |
| CH$_2$=CHCH$_2$Si(OC$_2$H$_5$)$_3$ | Allyltriethoxysilane |
| CH$_2$=CHCH$_2$Si(OCH$_3$)$_3$ | Allyltrimethoxysilane |
| C$_5$H$_{11}$Si(OC$_2$H$_5$)$_3$ | Amyltriethoxysilane |
| 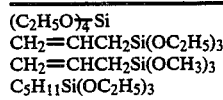 | Benzyltriethoxysilane |
| C$_4$H$_9$Si(OCH$_3$)$_3$ | n-Butyltrimethoxysilane |
| C$_2$H$_5$Si(OC$_2$H$_5$)$_3$ | Ethyltriethoxysilane |
| C$_2$H$_5$Si(OCH$_3$)$_3$ | Ethyltrimethoxysilane |
| CH$_3$(CH$_2$)$_5$Si(OCH$_3$)$_3$ | n-Hexyltrimethoxysilane |
| CH$_3$Si(OC$_2$H$_5$)$_3$ | Methyltriethoxysilane |
| CH$_3$Si(OCH$_3$)$_3$ | Methyltrimethoxysilane |
| CH$_3$(CH$_2$)$_{17}$Si(OC$_2$H$_5$)$_3$ | n-Octadecyltriethoxysilane |
| 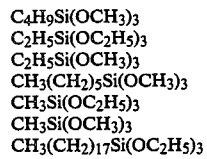 | Phenyltriethoxysilane |
| 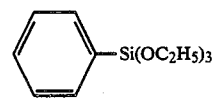 | Phenyltrimethoxysilane |
| CH$_3$(CH$_2$)$_2$Si(OCH$_3$)$_3$ | n-Propyltrimethoxysilane |
| (CH$_3$O)$_4$Si | Tetramethoxysilane |
| CH$_3$=CHSi(OC$_2$H$_5$)$_3$ | Vinyltriethoxysilane |
| CH$_2$=CHSi(OCH$_3$)$_3$ | Vinyltrimethoxysilane |
| NC(CH$_2$)$_2$Si(OC$_2$H$_5$)$_3$ | Cyanoethoxytriethoxysilane |

| | |
|---|---|
| NC(CH₂)₃S(CH₂)₃Si(OCH₃)₂<br>                                                              CH₃ | 3-(3-Cyanopropylthiopropyl)-methyl-dimethoxysilane |
| $C_8F_{17}CH_2CH_2Si(OC_2H_5)_3$ | (Heptadecafluoro-1,1,2,2-tetrahydrodecyltriethoxysilane |
| $C_6F_{13}CH_2CH_2Si(OC_2H_5)_3$ | (Tridecafluoro-1,1,2,2-tetrahydrooctyl)triethoxysilane |
| $CF_3CH_2CH_2$—Si(—OCH₃)₂<br>         CH₃ | (3,3,3-Trifluoropropyl)methyl-dimethoxysilane |
| $CF_3CH_2CH_2Si(OCH_3)_3$ | (3,3,3-Trifluoropropyl)trimethoxysilane |
| $CF_3C(=O)OCH_2CH_2CH_2Si(OCH_3)_3$ | 3-Trifluoroacetoxypropyl-trimethoxysilane |
| $CF_3CH_2CH_2Si(OC_2H_5)_3$ | (3,3,3-Trifluoropropyl)-triethoxysilane |

The epoxy resin composition of the invention can be prepared by any one of the following methods.

(i) The above epoxy resin, organopolysiloxane (a), organosilane compounds (b) to (e), and optionally other organosilane compounds (f) and/or (g) are mixed in the prescribed amounts, and the mixture is stirred.

(ii) The organopolysiloxane (a) is reacted with any one or two or more of the organosilane compounds (b) to (e) while preventing the undesirable gelation, and the reaction product is added to the epoxy resin, and the mixture is stirred, during which any one or two or more of the organosilane compounds (b) to (g) ar added in order to crosslink the organopolysiloxane (a).

(iii) The epoxy resin is reacted with any one or two or more of the organosilane compounds (b), (c) and (e), and thereto the organopolysiloxane (a) is added and optionally any one or two or more of the organosilane compounds (b) to (g) is further added thereto, and the mixture is stirred.

In the above methods, the crosslinking reaction of the organopolysiloxane (a) with the organosilane compounds (b) to (e) is carried out during stirring. The crosslinking reaction may be carried out at room temperature, but may optionally be carried out with heating and/or in the presence of a reaction catalyst (e.g. t-butyl tin oxide, lead octylate, tin octylate, tertiary amino compounds, water, etc.) in order to promote the reaction and to complete the reaction within a shorter period of time. The stirring is preferably done at a high speed so as to mix them uniformly, by which particles of silicone resin are prepared. The particle size of the resulting particles of silicone resin varies depending on the stirring efficiency.

The silicone resin particles thus obtained are stably dispersed within the epoxy resin matrix by the action of stirring, by which the desired composition of this invention is prepared in the form of a liquid or solid.

The epoxy resin composition of this invention is characteristic in that uniformly dispersed silicone resin particles are contained, by which the epoxy resin is given by improved flexibility without deterioration of strength under heat and hence is given by the desired excellent crack resistance and toughness.

The epoxy resin composition of this invention can be cured under usual conditions, for example, in the presence of a conventional curing agent suitable for conventional epoxy resins. The composition of this invention can be used for various utilities, for instance, as a sealing material for integrated circuit (IC) in view of its low dielectric constant, as a coating material for various materials, paint, adhesive or prepreg in view of its excellent water repellency, high impact strength and high flexibility.

This invention is illustrated by the following Examples, but should not be construed to be limited thereto.

EXAMPLE 1

To bisphenol A type epoxy resin (Epikote 828, manufactured by Yuka Shell K.K.) (100 parts by weight) is added t-butyl tin oxide (0.5 part by weight), and to the mixture are added silanol-terminated polydimethylsiloxane (in the formula [I], p=350-380, $R_1$=CH₃) (50 parts by weight) and γ-aminopropyltriethoxysilane (1 part by weight) with stirring at 80° C. The mixture is continuously stirred with heating for 6 hours. Then, the reaction mixture becomes a milky white liquid. After the reaction is completed, the reaction mixture is allowed to cool at room temperature to give an epoxy resin composition wherein silicone resin particles are uniformly dispersed in the epoxy resin. The composition has a viscosity of 26,000 cps (measured with type B viscometer at 25° C.), and has a particle size of the silicone resin particles of 0.5 to 3 μm (observed with a light microscope).

The epoxy resin composition is cured by incorporating with a modified aliphatic polyamine to give a cured product having an elastic modulus (at 20° C.) of $8.5 \times 10^9$ (dyne/cm²). As a reference, in case of Epikote 828 alone, the cured product has an elastic modulus of $1.1 \times 10^{10}$ (dyne/cm²).

EXAMPLE 2

In the same manner as described in Example 1, a mixture of bisphenol F type epoxy resin (Epikote 807, manufactured by Shell Chemical) (100 parts by weight) and t-butyl tin oxide (0.5 part by weight) are stirred at 80° C., and to the mixture are added the same organopolysiloxane as used in Example 1 (130 parts by weight) and γ-aminopropyltriethoxysilane (8 parts by weight), and the mixture is continuously stirred with heating for 6 hours, and then, the reaction mixture is allowed to cool to give an epoxy resin composition which is a milky white liquid. The composition has a viscosity of 180,000 cps and a particle size of the silicone resin particles of 1 to 10 μm. The cured product obtained by incorporating with a modified aliphatic polyamine has an elastic modulus of $3.6 \times 10^9$ (dyne/cm$^2$).

EXAMPLE 3

In the same manner as described in Example 1, a mixture of bisphenol A type epoxy resin (Epikote 1001, manufactured by Yuka Shell K.K.) (90 parts by weight), an ester type epoxy resin (Epikote 871, manufactured by Shell Chemical) (10 parts by weight) and t-butyl tin oxide (0.5 part by weight) are stirred at 90° C., and thereto are added the same liquid organopolysiloxane as used in Example 1 (15 parts by weight) and N-β-(aminoethyl)-γ-aminopropyltrimethoxysilane (0.8 part by weight), and the mixture is continuously stirred with heating for 3 hours, and then, the reaction mixture is allowed to cool to give a semi-solid epoxy resin composition. The composition has a particle size of the silicone resin particles of 1 to 3 μm.

EXAMPLE 4

To bisphenol F type epoxy resin (Epikote 807) (100 parts by weight) are added t-butyl tin oxide (0.5 part by weight), a liquid organopolysiloxane [in the formula [I], $R_1 = CH_3$, mean molecular weight=1700 (n=20)] (5 parts by weight), N-β-(aminoethyl)-γ-aminopropyltrimethoxysilane (0.5 part by weight), and tetraethoxysilane (0.5 part by weight), and the mixture is stirred at room temperature for 6 hours to give an epoxy resin composition which is a milky white liquid. The composition has a viscosity of 4,000 cps and a particle size of the silicone resin particles of 0.5 to 2 μm.

EXAMPLE 5

To novolak type epoxy resin (Epikote 154) (100 parts by weight) is added t-butyl tin oxide (0.5 part by weight), and to the mixture are added the same liquid organopolysiloxane as used in Example 1 (50 parts by weight) and γ-aminopropyltriethoxysilane (1 part by weight) with stirring at 80° C., and the mixture is stirred at 80° C. for 3 hours to give an epoxy resin composition which is a milky white, high viscous liquid. The composition has a viscosity of 50,000 cps (measured with type B viscometer at 25° C.) and has a particle size of the silicone resin particles of 2 to 12 μm.

EXAMPLE 6

To bisphenol A type epoxy resin (Epikote 1001, manufactured by Yuka Shell K.K.) (100 parts by weight) is added silanol-terminated polytetramethyl-p-silylphenylenesiloxane (molecular weight=150,000) (10 parts by weight) and to the mixture are added t-butyl tin oxide (0.5 part by weight) and γ-aminopropyltriethoxysilane (0.5 part by weight) with stirring at 150° C., and the mixture is continuously stirred with heating for 3 hours to give an epoxy resin composition which is a pale yellow solid at room temperature. The composition has a particle size of the silicone resin particles of about 2 to 5 μm.

EXAMPLE 7

To bisphenol A type epoxy resin (Epikote 828, manufactured by Yuka Shell K.K.) (100 parts by weight) is added t-butyl tin oxide (0.5 part by weight), and to the mixture are added silanol-terminated polydimethyldiphenylsiloxane (in the formula [I'], p=28, q=1) (50 parts by weight) and γ-aminopropyltriethoxysilane (1 part by weight) and phenyltrimethoxysilane (7 parts by weight) with stirring at 80° C. The mixture is continuously stirred with heating for 6 hours to give an epoxy resin composition which is a milky white liquid. The composition has a viscosity of 42,000 cps (measured with type B viscometer at 25° C.), and has a particle size of the silicone resin particles of 0.5 to 2 μm (observed with a light microscope).

EXAMPLE 8

To bisphenol A type epoxy resin (Epikote 1001, manufactured by Yuka Shell K.K.) (100 parts by weight) is added t-butyl tin oxide (0.5 part by weight), and to the mixture is added γ-isocyanatopropyltrimethoxysilane (4 parts by weight) with stirring at 100° C. under $N_2$ atmosphere. The mixture is continuously stirred with heating for 5 hours, and it is confirmed as to no absorption of isocyanate group by IR. Thereafter, in the same manner as described in Example 1, the same liquid organopolysiloxane (30 parts by weight) is added to the reaction mixture and the mixture is stirred with heating in air for 6 hours to give an epoxy resin composition which is a solid. The epoxy resin composition thus obtained has a particle size of the silicone resin particles of 2 to 5 μm.

EXAMPLE 9

To bisphenol A type epoxy resin (Epikote 828, manufactured by Yuka Shell K.K.) (100 parts by weight) is added t-butyl tin oxide (0.5 part by weight), and to the mixture are added the same liquid organopolysiloxane as used in Example 1 (30 parts by weight) and 3-mercaptopropyltrimethoxysilane (2 parts by weight) and further water (0.5 part by weight) with stirring at 80° C., and the mixture is further stirred with heating to give an epoxy resin composition which is a milky white liquid. The composition has a viscosity of 20,000 cps (measured with type B viscometer at 25° C.), and has a particle size of the silicone resin particles of 0.5 to 2 μm.

EXAMPLE 10

To bisphenol A type epoxy resin (Epikote 828, manufactured by Yuka Shell K.K.) (100 parts by weight) is added t-butyl tin oxide (0.5 part by weight), and to the mixture are added the same liquid organopolysiloxane as used in Example 1 (30 parts by weight) and 3-glycidoxypropyltrimethoxysilane (1 part by weight) with stirring at 80° C., and the mixture is continuously stirred with heating for 6 hours. The epoxy resin composition thus obtained is a milky white liquid. The composition has a viscosity of 32,000 cps (measured with type B viscometer at 25° C.), and has a particle size of the silicone resin particles of 3 to 8 μm.

EXAMPLE 11

To silanol-terminated polydimethylsiloxane (in the formula [I], p=7) (10 parts by weight) are added (3,3,3-trifluoropropyl)methyldimethoxysilane (2.5 parts by weight) and t-butyl tin oxide (0.5 part by weight), and the mixture is subjected to condensation reaction at 50° C. under nitrogen atmosphere for 24 hours. The completion of the reaction is confirmed by disappearance of IR absorption of methoxy group. Thereafter, to the mixture are added bisphenol A type epoxy resin (Epikote 828, manufactured by Yuka Shell K.K.) (100 parts by weight) and γ-aminopropyltriethoxysilane (1.0 part by weight), and the mixture is stirred at 80° C. in air for 6 hours. The epoxy resin composition thus obtained is a milky white liquid. The composition has a viscosity of 24,000 cps (measured with type B viscometer at 25° C.), and has a particle size of the silicone resin particles of 0.5 to 2 μm.

What is claimed is:

1. An epoxy resin composition which comprises 100 parts by weight of an epoxy resin which is dispersed with silicone resin particles comprising a cross-linking reaction product of (a) 5 to 200 parts by weight of at least one of an organopolysiloxane having silanol groups at both ends of the following formula:

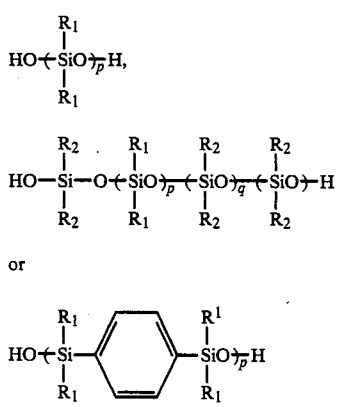

wherein $R_1$ is methyl or phenyl, $R_2$ is phenyl, p is an integer of 9 to 500, and q is 0 or less than 6% of p, with one or more organosilane compounds having at least two alkoxysilyl groups in one molecule which are selected from the group consisting of (b) an aminosilane compound of the formula:

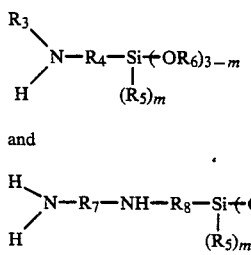

wherein $R_3$ is hydrogen, phenyl, benzyl, cyclohexyl, vinylbenzyl, or allyl, $R_4$ is $-C_2H_4-$, $-C_3H_6-$ or $-C_2H_4SC_2H_4-$, $R_5$ and $R_6$ are the same or different and are each methyl or ethyl, $R_7$ is $-C_2H_4-$, $-C_2H_4SC_2H_4-$, $-C_2H_4NHC_2H_4-$, or $-CO-$, $R_8$ is $-C_2H_4-$ or $-C_3H_6-$, and m is 0 or 1, (c) a mercapto compound of the formula:

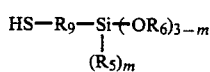

wherein $R_5$, $R_6$ and m are as defined above, and $R_9$ is $-C_3H_6-$ or $-CH_2-$, (d) an epoxy silane compound of the formula:

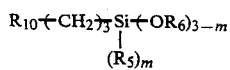

and

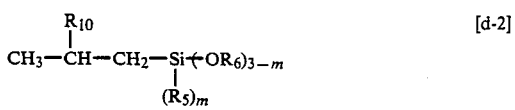

wherein $R_5$, $R_6$ and m are as defined above, and $R_{10}$ is

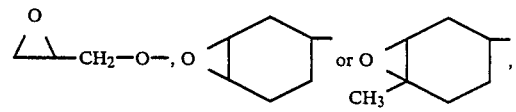

and (e) an isocyanatosilane compound of the formula:

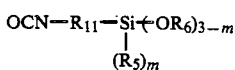

wherein $R_5$, $R_6$ and m are as defined above, and $R_{11}$ is $-A-$ or $-Q-NHCOX-A-$ wherein A is an alkylene having one to 3 carbon atoms, Q is a diisocyanate residue, and X is $-NH-$, $-O-$ or $-S-$, said organopolysiloxane and said organosilane compound being used in a molar ration of the alkoxy groups in the organosilane compound and the hydroxy groups in the organopolysiloxane $[OR_6]/[OH]$ of 0.1 to 15.

2. The composition according to claim 1, wherein the reaction product further comprises one or more of additional organosilane compounds selected from (f) organosilane compounds of the formula:

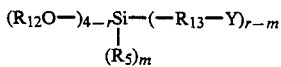

wherein $R_5$ is as defined above, $R_{12}$ is methyl or ethyl, $R_{13}$ is $-CH_2-$, $-C_2H_4-$ or $-C_3H_6-$, Y is $CH_2=CH-$, $C_6H_5-$, $C_nF_{2n+1}$ wherein n=1-10, $CF_3COO-$, $NC-$, or $NC(CH_2)_3S-$, r is 0, 1 or 2, m is 0 when r is 0 or 1, and m is 0 or 1 when r is 2, or (g) organosilane compounds of the formula:

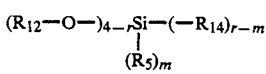

wherein $R_5$ and $R_{12}$ are as defined above, $R_{14}$ is $C_{n'}H_{2n'+1}$ wherein n'=1-20, $CH_2=CH-$, or $C_6H_5-$, r is 0, 1 or 2, m is 0 when r is 0 or 1, and m is 0 or 1 when r is 2.

3. The composition according to claim 1, which comprises a dispersion of 100 parts by weight of the epoxy resin of the formula [I] with the crosslinking reaction product of 5 to 200 parts by weight of the organopolysiloxane having silanol groups at both ends (a) and 0.5 to 10 parts by weight of the organosilane compound (b) selected from the compounds of the formulae [b-1] or [b-2].

4. The composition according to claim 2, wherein the organosilane compounds (b) of the formulae [b-1] and [b-2] wherein m is 1 are used and the organosilane compound (f) wherein m is 0 is used in an amount of 0.5 to 10 parts by weight.

5. The composition according to claim 4, wherein the organosilane compound (b) of the formula [b-1] or [b-2] wherein m is 1 is used together the organosilane compound (b) of the formula [b-1] or [b-2] wherein m is 0 in the ratio of the compound m=0 to the compound m=1 being in the range of 1 : 4 or more by weight, and the organosilane compound (f) is used in an amount of 0.5 to 5 parts by weight.

* * * * *